(12) United States Patent
Kimura et al.

(10) Patent No.: US 10,878,750 B2
(45) Date of Patent: Dec. 29, 2020

(54) SEMICONDUCTOR DEVICE, DISPLAY DEVICE, AND ELECTRONIC DEVICE

(71) Applicant: Semiconductor Energy Laboratory Co., Ltd., Atsugi (JP)

(72) Inventors: Kiyotaka Kimura, Atsugi (JP); Hidetomo Kobayashi, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/490,679

(22) PCT Filed: Mar. 7, 2018

(86) PCT No.: PCT/IB2018/051454
§ 371 (c)(1),
(2) Date: Sep. 3, 2019

(87) PCT Pub. No.: WO2018/167605
PCT Pub. Date: Sep. 20, 2018

(65) Prior Publication Data
US 2020/0013332 A1    Jan. 9, 2020

(30) Foreign Application Priority Data
Mar. 17, 2017 (JP) .................. 2017-052965

(51) Int. Cl.
*G06F 3/038* (2013.01)
*G09G 5/00* (2006.01)
(Continued)

(52) U.S. Cl.
CPC ......... *G09G 3/3233* (2013.01); *G09G 3/3275* (2013.01); *G09G 3/36* (2013.01);
(Continued)

(58) Field of Classification Search
CPC ................... G06F 3/044; G06F 3/0416
See application file for complete search history.

(56) References Cited

U.S. PATENT DOCUMENTS 5,959,472 A     9/1999  Nagamatsu et al.
2004/0036670 A1  2/2004  Chung
(Continued)

FOREIGN PATENT DOCUMENTS

CN     001485810 A    3/2004
CN     102034420 A    4/2011
(Continued)

OTHER PUBLICATIONS

Kawashima.S et al., "13.3-in. 8K×4K 664-ppi OLED Display Using CAAC-OS FETs", SID Digest '14 : SID International Symposium Digest of Technical Papers, Jun. 3, 2014, pp. 627-630.
(Continued)

*Primary Examiner* — Nan-Ying Yang
(74) *Attorney, Agent, or Firm* — Robinson Intellectual Property Law Office; Eric J. Robinson

(57) ABSTRACT

A method for reducing power consumption of a source driver included in a display device and suppressing heat generation is provided. In a display device in which each pixel is supplied with a data signal of image data through a source line, a source driver is included, each source line is electrically connected to the source driver, and the source driver has a function of driving the source lines. In the case where the amount of change of the data signal of the image data is small, in other words, in the case where power for charging and discharging the source line can be small, the source driver reduces the apparent size of the transistor at the output stage, and power consumption can be reduced. Furthermore, the amount of heat generation can be reduced.

13 Claims, 9 Drawing Sheets

(51) Int. Cl.
  *G09G 3/3233* (2016.01)
  *G09G 3/3275* (2016.01)
  *G09G 3/36* (2006.01)
  *H01L 27/12* (2006.01)
  *H01L 29/786* (2006.01)

(52) U.S. Cl.
  CPC .......... *G09G 2310/0291* (2013.01); *G09G 2330/021* (2013.01); *G09G 2360/16* (2013.01); *H01L 27/124* (2013.01); *H01L 27/1225* (2013.01); *H01L 29/7869* (2013.01)

(56) References Cited

U.S. PATENT DOCUMENTS

| | | | |
|---|---|---|---|
| 2009/0002358 A1* | 1/2009 | Tamura | G09G 3/3688 345/212 |
| 2010/0182521 A1* | 7/2010 | Inoue | G02F 1/133707 349/33 |
| 2011/0080214 A1 | 4/2011 | Tsuchi | |
| 2011/0273223 A1 | 11/2011 | Sakamoto et al. | |
| 2012/0032942 A1 | 2/2012 | Toyotaka et al. | |
| 2013/0321384 A1 | 12/2013 | Tsuchiya et al. | |
| 2014/0292735 A1 | 10/2014 | Kishikawa | |
| 2015/0049073 A1* | 2/2015 | Morita | G09G 3/3614 345/211 |
| 2015/0195881 A1* | 7/2015 | Dan | G09G 3/3426 315/192 |

FOREIGN PATENT DOCUMENTS

| | | |
|---|---|---|
| CN | 104077993 A | 10/2014 |
| JP | 2004-078216 A | 3/2004 |
| JP | 2008-026342 A | 2/2008 |
| JP | 2009-009018 A | 1/2009 |
| JP | 2011-082836 A | 4/2011 |
| JP | 2012-053454 A | 3/2012 |
| JP | 2014-197120 A | 10/2014 |
| KR | 2004-0017157 A | 2/2004 |
| KR | 2012-0023548 A | 3/2012 |
| TW | 200403625 | 3/2004 |
| TW | 201218160 | 5/2012 |
| WO | WO-2010/095306 | 8/2010 |
| WO | WO-2012/111553 | 8/2012 |

OTHER PUBLICATIONS

International Search Report (Application No. PCT/IB2018/051454) dated Jun. 19, 2018.

Written Opinion (Application No. PCT/IB2018/051454) dated Jun. 19, 2018.

* cited by examiner

SEMICONDUCTOR DEVICE, DISPLAY DEVICE, AND ELECTRONIC DEVICE

TECHNICAL FIELD

One embodiment of the present invention relates to a semiconductor device. Specifically, one embodiment of the present invention relates to a source driver included in a display device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter.

Specific examples of the technical field of one embodiment of the present invention disclosed in this specification and the like include a semiconductor device, a display device, an electronic device, a method for driving any of them, and a method for manufacturing any of them. In this specification and the like, a semiconductor device generally means a device that can function by utilizing semiconductor characteristics. For example, an integrated circuit, a chip including an integrated circuit, an electronic component including a packaged chip, and an electronic device including an integrated circuit are examples of a semiconductor device.

BACKGROUND ART

A demand for high-resolution images, that is, an image with a large number of pixels is increased in accordance with an increase in screen size of a display device such as television (TV). In Japan, broadcast service for a high-definition television which is referred to as ultra-high definition (also referred to as "4K resolution","4K2K", and "4K") that has four times as much pixels as full-high definition (Full HD) does was started in 2015. Furthermore, super-high definition (also referred to as "8K resolution", "8K4K", and "8K") that has four times as much pixels as ultra-high definition does was started in 2016. Furthermore, electronic devices for super-high definition are under development (Non-patent document 1).

Here, a display device which is referred to as full-high definition typically includes 1920×1080 pixels, a display device which is referred to as ultra-high-definition typically includes 3840×2160 pixels, and a display device which is referred to as super high-definition typically includes 7680×4320 pixels.

Furthermore, an increased frame frequency of the display device is desired. The frame frequency is the number of times of display image rewriting by the display device per second. The frame frequency is increased, whereby smooth display of moving images without flickers is achieved. The frame frequency of full-high definition is approximately 30 Hz (60 Hz interlace) or approximately 60 Hz; while the aim of the super-high definition is 120 Hz.

REFERENCE

Patent Document

[Patent Document 1] PCT International Publication No. 2010/095306

Non-Patent Document

[Non-Patent Document 1] S. Kawashima, et al., "13.3-In. 8K×4K 664-ppi OLED Display Using CAAC-OS FETs," SID 2014 DIGEST, pp. 627-630.

DISCLOSURE OF INVENTION

To each pixel of a display device, a data signal of image data is supplied through a source line. Source lines are electrically connected to source drivers in the display device and the source drivers have a function of driving the source lines. An integrated circuit (IC), which is also referred to as a driver IC, is used for a source driver.

Here, the frame frequency is increased, whereby the time for charging and discharging the source line is reduced. Furthermore, the number of pixels of the display device is increased, whereby the amount of data of the data signals supplied to the pixels through the source lines is increased, and the time for charging and discharging the source line is reduced. In order to charge and discharge the source line in a short time, the drive capability of the source driver needs to be improved.

Furthermore, when the source line become longer in accordance with an increase in screen size of the display device, the parasitic capacitance of the source line is increased; thus, the drive capacity of the source drivers needs to be improved. In such a case, in order to improve the drive capacity of the source drivers, the transistor size at an output stage of the source driver needs to be increased; however, there is a problem in that the power consumption is increased.

As the power consumption of the source driver is increased, the amount of generated heat becomes large. When the number of pixels of the display device is increased, the number of source lines is increased. When the density of arrangement of the source drivers is increased, there is a problem in that the temperature of the source driver is too high. In addition to the problem in that the power consumption of the source driver is increased, the temperature of the source driver also needs to be taken in consideration.

For example, a method for suppressing heat generation of the source driver by providing a switch which distributes an output signal of the source driver to a plurality of output terminals by time division between the source driver and the pixel is disclosed in Patent Document 1. However, the method of time-dividing the output signal of the source driver is not appropriate for the display device which needs to perform charge and discharge of the source line in a short time.

An object of one embodiment of the present invention is to provide a novel source driver with low power consumption. Another object of one embodiment of the present invention is to provide a novel source driver with low power consumption and a small amount of heat generation. Another object of one embodiment of the present invention is to provide a novel semiconductor device with low power consumption. Another object of one embodiment of the present invention is to provide a novel semiconductor device with low power consumption and a small amount of heat generation. Another object of one embodiment of the present invention is to provide a display device using a novel source driver. Another object of one embodiment of the present invention is to provide an electronic device including a display device with a novel source driver.

Note that one embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

One embodiment of the present invention is a semiconductor device including a data register, a controller, a D/A converter, and a buffer amplifier. The data register has a function of storing first data and second data and outputs the first data and the second data alternately to the D/A converter. The D/A converter has a function of converting the first or second data input from the data register into an analog signal. The buffer amplifier has functions of amplifying the analog signal and charging and discharging a predetermined load within predetermined time. The controller calculates the amount of change between the first data and the second data and invalidates some of transistors included in the buffer amplifier when the amount of change is smaller than a predetermined amount.

Another embodiment of the present invention is a display device including a pixel array and a source driver. The pixel array includes source lines and pixels. The source driver includes a data register, a controller, a D/A converter, and a buffer amplifier. The data register has a function of storing first image data and second image data and outputs the first image data and the second image data alternately to the D/A converter. The D/A converter has a function of converting the first or second image data input from the data register into an analog signal. The buffer amplifier has functions of amplifying the analog signal and supplying the amplified data to the source line within the predetermined time. The controller calculates the amount of change between the first image data and the second image data and invalidates some of transistors included in the buffer amplifier when the amount of change is smaller than the predetermined amount.

Furthermore, in the above embodiment, the pixel array includes gate lines. The pixels are arranged in a matrix in a direction parallel to the source line and in a direction parallel to the gate line. The number of pixels arranged in a direction parallel to the source line is N times (N is an integer greater than or equal to 2) the number of gate lines, and the number of pixels arranged in a direction parallel to the gate line is 1/N times the number of source lines.

In the above embodiment, the pixel includes a transistor including a metal oxide in a channel formation region.

The number of transistors at the output stage of the source driver is changed in accordance with the loads, so that the apparent size of the transistor is changed and power consumption can be reduced. Thus, in the case where electric power for charging and discharging the source line is small, the transistor size at the output stage of the source driver can be small and power consumption can be reduced.

In the present invention, while the drive capability of the source driver is increased, the power consumption can be reduced. Furthermore, the amount of heat generation can be reduced. Thus, the source driver which can achieve both the drive capability which is compatible with the increase in screen size of the display device, increase in the number of pixels, increase in frame frequency, and the like and low power consumption can be provided. Even when the density of arrangement of the source drivers is increased, the problem of the temperature of the source driver being too high can be solved.

According to one embodiment of the present invention, a source driver with a novel structure can be provided. Furthermore, a semiconductor device with a novel structure can be provided. Furthermore, a display device including a source driver with a novel structure can be provided. Furthermore, an electronic device including a display device including a source driver with a novel structure can be provided.

Note that the effects of one embodiment of the present invention are not limited to the above effects. The effects described above do not disturb the existence of other effects. The other effects are effects that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BEST MODE FOR CARRYING OUT THE INVENTION

Figure 1:
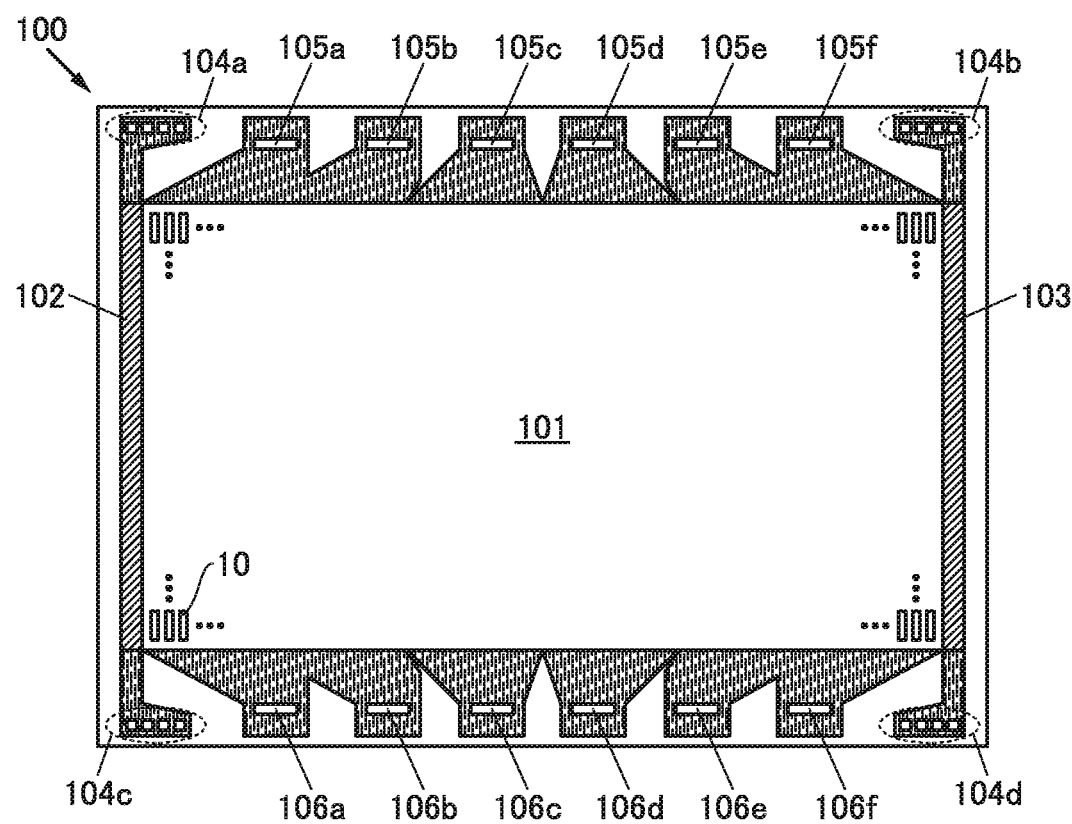
FIG. 1 is a top view of a structure example of a display device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Any of the embodiments described below can be combined as appropriate.

Note that a display device described in the embodiments is a semiconductor device including a pixel array, a gate driver, a source driver, and the like. Therefore, a display device is referred to as a semiconductor device, an electronic device, or the like in some cases.

In the drawings, the size, the layer thickness, the region, or the like is sometimes exaggerated for clarity, and thus is not limited to the illustrated scale. The drawings are schematic views of ideal examples, and the embodiments of the present invention are not limited to the shape or the value illustrated in the drawings.

In the drawings and the like, the same elements, elements having similar functions, elements formed of the same material, elements formed at the same time, and the like are sometimes denoted by the same reference numerals, and the description thereof is not repeated in some cases.

In this specification and the like, the terms "film" and "layer" can be interchanged with each other. For example, the term "conductive layer" can be changed into the term "conductive film" in some cases, and the term "insulating film" can be changed into the term "insulating layer" in some cases.

In this specification and the like, the terms for describing arrangement such as "over" and "under" do not necessarily mean directly on and directly below, respectively, in the description of a physical relationship between components. For example, the expression "a gate electrode over a gate insulating layer" can mean the case where there is an additional component between the gate insulating layer and the gate electrode.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, ordinal numbers such as "first", "second", and "third" are used in order to avoid confusion among components, and the terms do not limit the components numerically.

In this specification and the like, the term "electrically connected" includes the case where components are connected through an "object having any electric function". There is no particular limitation on the "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

In this specification and the like, the term "voltage" often refers to a difference between a given potential and a reference potential (e.g., a ground potential). Therefore, the terms "voltage" and "potential difference" can be replaced with each other.

In this specification and the like, a transistor is an element having at least three terminals: a gate, a drain, and a source. The transistor has a channel region between a drain (a drain terminal, a drain region, or a drain electrode) and a source (a source terminal, a source region, or a source electrode), and current can flow between the source and the drain through the channel region. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in this specification and the like.

Unless otherwise specified, off-state current in this specification and the like refers to drain current of a transistor in an off state (also referred to as a non-conducting state and a cutoff state). Unless otherwise specified, the off state of an n-channel transistor means that a gate voltage with respect to a source voltage ($V_{gs}$) is lower than the threshold voltage ($V_{th}$), and the off state of a p-channel transistor means that $V_{gs}$ is higher than $V_{th}$. That is, the off-state current of an n-channel transistor sometimes refers to a drain current that flows when the gate voltage with respect to the source voltage $V_{gs}$ is lower than the threshold voltage $V_{th}$.

In the above description of off-state current, a drain may be replaced with a source. That is, the off-state current sometimes refers to a source current when the transistor is in an off state.

In this specification and the like, the term "leakage current" sometimes expresses the same meaning as "off-state current". In this specification and the like, the off-state current sometimes refers to a current that flows between a source and a drain when a transistor is in the off state.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. That is to say, a metal oxide that has at least one of an amplifying function, a rectifying function, and a switching function can be called a metal oxide semiconductor, or OS for short. An OS transistor or an OS FET refers to a transistor including a metal oxide or an oxide semiconductor.

Embodiment 1

In this embodiment, a display device including a pixel array, a gate driver, and a source driver will be described.

<Display Device>

FIG. 1 is a top view illustrating a structure example of a display device.

A display device 100 includes a pixel array 101, a gate driver 102, a gate driver 103, terminals 104a to 104d, source drivers 105a to 105f, and source drivers 106a to 106f.

The pixel array 101 includes a plurality of pixels 10. Each of the pixels 10 is an active element driven by a transistor. The pixel array 101 has a function of forming a display region of the display device 100 and displaying an image. A more specific structure example of the pixel 10 will be described in Embodiment 2.

The gate driver 102 and the gate driver 103 (hereinafter, referred to as gate drivers 102 and 103) have a function of driving a gate line for selecting the pixel 10. Either the gate driver 102 or the gate driver 103 is not necessarily provided. Note that although FIG. 1 illustrates an example in which the gate drivers 102 and 103 are provided together with the pixel array 101 over the same substrate, the gate drivers 102 and 103 can be dedicated ICs.

The source drivers 105a to 105f and the source drivers 106a to 106f have a function of driving source lines that supply data signals to the pixels 10. The source drivers 105a to 105f and the source drivers 106a to 106f may be only the source drivers 105a to 105f or only the source drivers 106a to 106f.

IC are used for the source drivers 105a to 105f and the source drivers 106a to 106f. Although IC are mounted by a chip on glass (COG) method in FIG. 1, there is no particular limitation on the mounting method, and a chip on flexible (COF) method, a tape automated bonding (TAB) method, or the like may be employed.

Note that although FIG. 1 shows an example where six source drivers are mounted on one side of the display device 100, there is no limitation on the number of source drivers. The source drivers are provided according to the number of pixels in the pixel array 101 and the number of output terminals of the source driver.

<Pixel Array 1>

Figure 2:
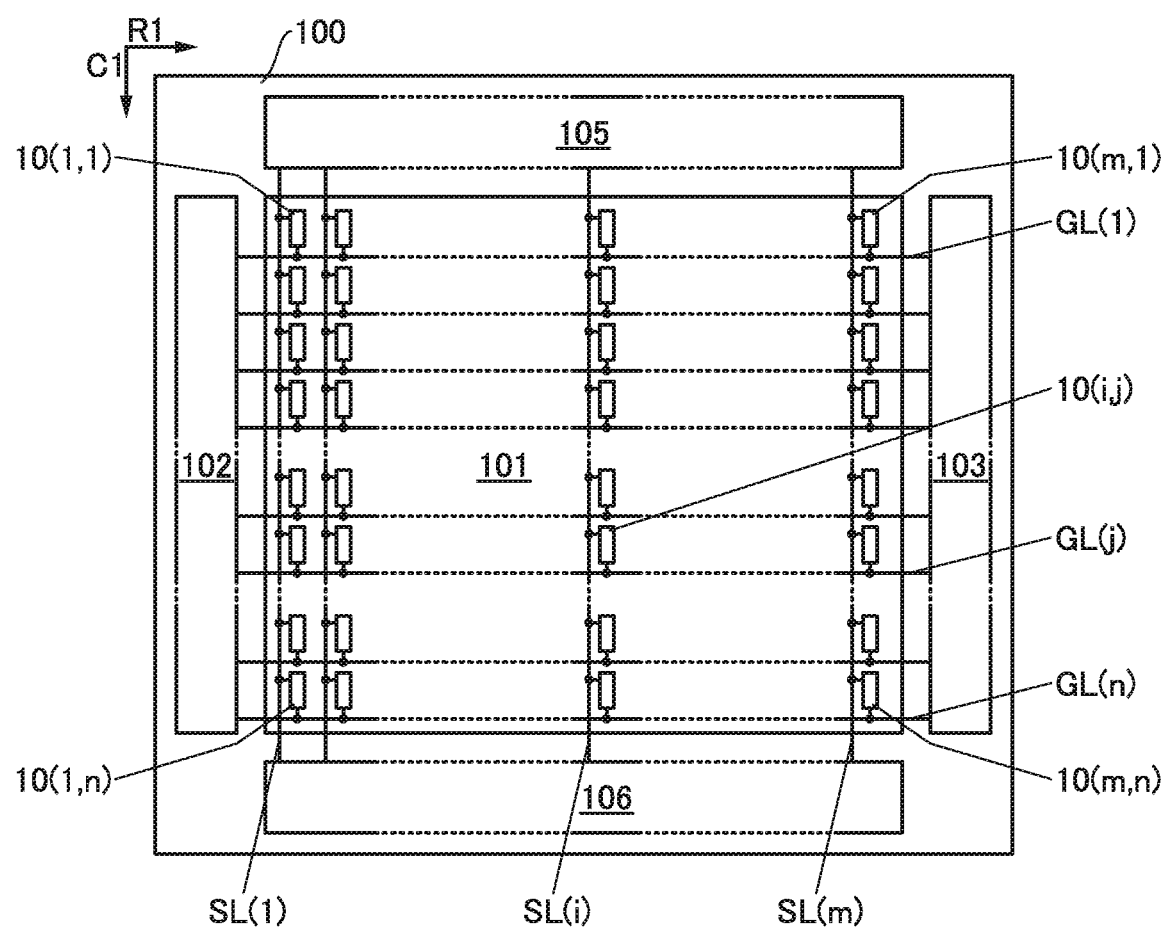
FIG. 2 is a block diagram illustrating a configuration example of a display device.

FIG. 2 is a block diagram illustrating a configuration example of the display device 100.

The pixel array 101 includes pixels 10(1,1) to 10(m,n), source lines SL(1) to SL(m), and gate lines GL(1) to GL(n). Here, m and n are each an integer greater than or equal to 1, i is an integer greater than or equal to 1 and less than or equal to m, and j is an integer greater than or equal to 1 and less than or equal to n. In FIG. 2, a constant potential line and the like for forming a power source line or a capacitor are omitted.

The gate drivers 102 and 103 are electrically connected to the pixel array 101 through the gate lines GL(1) to GL(n). The source drivers 105a to 105f and the source drivers 106a to 106f are electrically connected to the pixel array 101 through the source lines SL(1) to SL(m). Note that the source drivers 105a to 105f are collectively denoted as a source driver 105 and the source drivers 106a to 106f are collectively denoted as a source driver 106 in FIG. 2.

A group of pixels 10(1,j) to 10(m,j) arranged in the direction indicated by an arrow R1 are electrically connected to a gate line GL(j). The gate drivers 102 and 103 drive the gate line GL(j) and select the pixels 10(1,j) to 10(m,j).

A group of pixels 10(i,1) to 10(i,n) arranged in the direction indicated by an arrow C1 are electrically connected to a source line SL(i). The source drivers 105 and 106 (hereinafter denoted as the source drivers 105 and 106) supply the data signals of the image data to the pixels 10(1,j) to 10(m,j) through the source lines SL(1) to SL(m). By repeating this operation from the gate line GL(1) to the gate line GL(n), the display device 100 can display an image on the pixel array 101.

Various display elements such as a liquid crystal element, electronic paper, an organic electroluminescent (EL) element, and a quantum-dot light-emitting diode (QLED) can be used in the pixel 10.

<Pixel Array 2>

Figure 3:
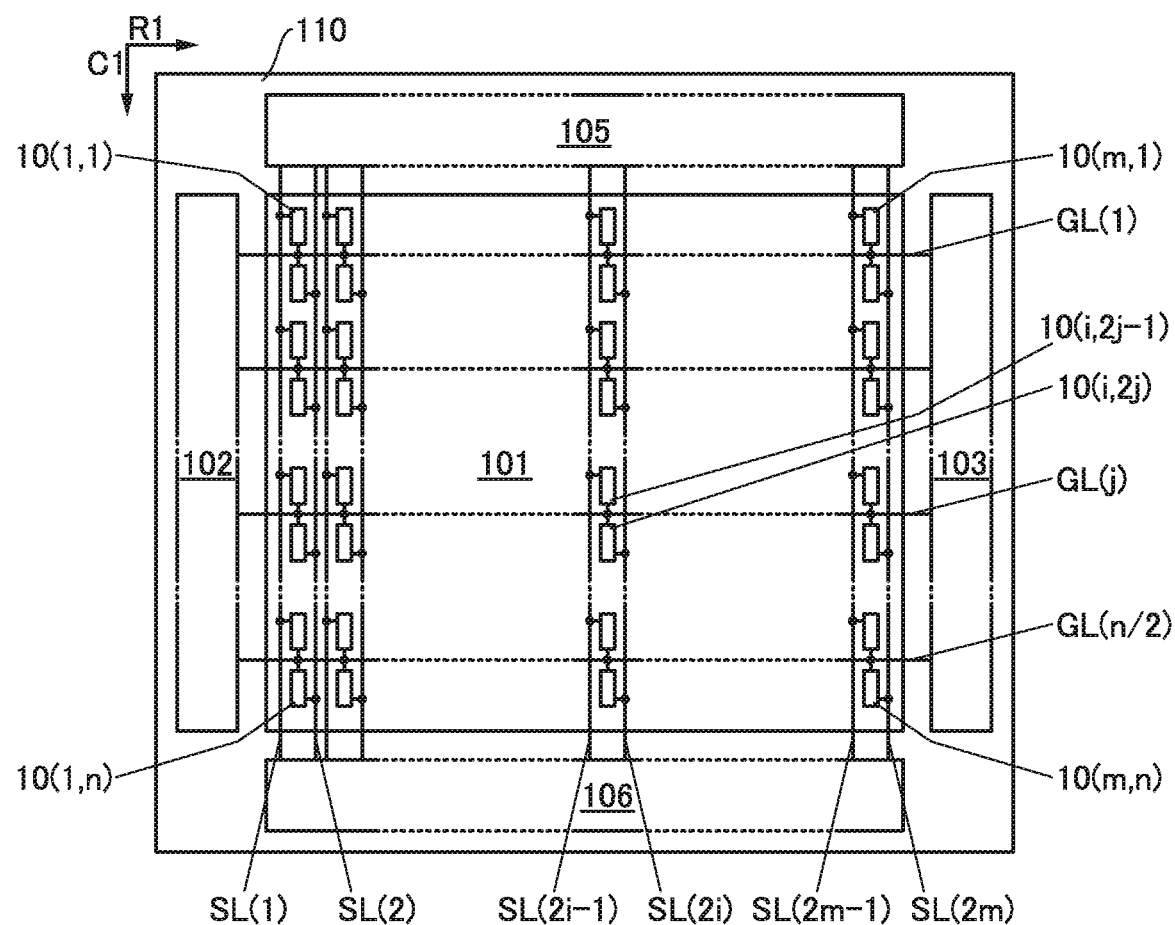
FIG. 3 is a block diagram illustrating a configuration example of a display device.

Next, the display device 100 is described using a display device 110 in FIG. 3 which has a configuration example different from that in FIG. 2. In the display device 110, the number of pixels is the same as the display device 100; however, the number of source lines and the number of gate lines are different from those in the display device 100.

The pixel array 101 included in the display device 110 includes pixels 10(1,1) to 10(m,n), source lines SL(1) to SL(2m), and gate lines GL(1) to GL(n/2). Note that m and n are each an integer greater than or equal to 1, i is an integer greater than or equal to 1 and less than or equal to m, and j is an integer greater than or equal to 1 and less than or equal to n/2. The constant potential line and the like for forming a power source line and a capacitor are not illustrated.

The gate drivers 102 and 103 are electrically connected to the pixel array 101 through the gate lines GL(1) to GL(n/2). The source drivers 105 and 106 are electrically connected to the pixel array 101 through the source lines SL(1) to SL(2m).

A group of pixels 10(1,2j−1) to 10(m,2j−1) and a group of pixels 10(1,2j) to 10(m,2j) arranged in the direction indicated by an arrow R1 are electrically connected to the gate line GL(f). The gate drivers 102 and 103 drive the gate line GL(j) and select the pixels 10(1,2j−1) to 10(m,2j−1) and the pixels 10(1,2j) to 10(m,2j).

In the group of pixels 10(i,1) to 10(i,n) arranged in the direction indicated by an arrow C1, a pixel 10(i,2j−1) is electrically connected to a source line SL(2i−1), and a pixel 10(i,2j) is electrically connected to a source line SL(2i).

The source drivers 105 and 106 supply data signals of the image data to the pixels 10(1,2j−1) to 10(m,2j−1) and the pixels 10(1,2j) to 10(m,2j) through the source lines SL(1) to SL(2m). By repeating this operation from the gate line GL(1) to the gate line GL(n/2), the display device 110 can display an image on the pixel array 101.

Here, the number of gate lines of the display device 110 is smaller than that of the display device 100; thus, the time for selecting a pixel by a gate line can be increased. That is, the time for charging and discharging the source line can be increased. Note that the number of source lines is large; thus, the number of output terminals of the source drivers 105 and 106 needs to be increased. Furthermore, in the pixel 10, the proportion of the area occupied by the display element is small in some cases.

The configuration example of the display device 110 is effective in the case where the parasitic capacitance of the source line is increased in accordance with the increase in screen size of the display device, in the case where the time for charging and discharging of the source line is reduced in accordance with the increase in the number of pixels of the display device, in the case where the time for charging and discharging the source line is reduced in accordance with the increase in the frame frequency of the display device, and the like. In particular, this configuration example is effective for a high-definition display device, such as ultra-high definition (3840×2160) and super-high definition (7680×4320).

In the display device 110, the number of gate lines is half the number of gate lines in the display device 100 and the number of source lines is twice the number of source lines in the display device 100; however, the combination is not limited to this and a variety of combinations can be considered.

Note that the pixel 10 shows the minimum display unit in FIGS. 1 to 3. That is, in the case where the display device 100 or the display device 110 is full-high-definition (1920×1080) including the pixels of RGB (red, green, and blue), the pixel array 101 includes 1920×1080×3 pixels 10. The structure of the pixels of the display device 100 and the display device 110 are not limited to this. For example, the display device 100 and the display device 110 may include either pixels of RGBW (red, green, blue, and white) or pixels of RGBY (red, green, blue, and yellow). A variety of combinations can be considered.

<Source Driver>

Figure 4A:
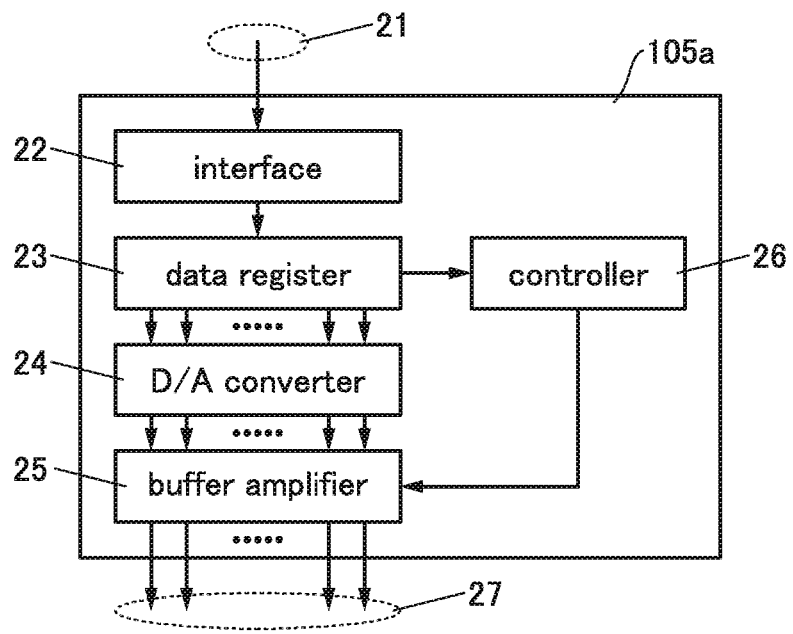
FIG. 4A is a block diagram illustrating a configuration example of a source driver and FIG. 4B is a graph showing a change in potential by charging a source line.

The block diagram shown in FIG. 4A is a configuration example of a source driver applicable to the source drivers 105a to 105f and the source drivers 106a to 106f.

The source driver 105a shown in FIG. 4A includes an interface 22, a data register 23, a digital to analog converter (D/A converter) 24, a buffer amplifier 25, and a controller 26.

The image data, the control signal, and the like are input from an external semiconductor device 21 such as an application processor to the source driver 105a, and the source driver 105a outputs data signals to output terminals 27 which are electrically connected to the source lines.

As the interface 22, low voltage differential signaling (LVDS), mobile industry processor interface (MIPI), serial peripheral interface (SPI), or the like can be used. The input image data is saved in the data register 23 through a serial-parallel conversion circuit and the like.

The data register 23 has a function of saving the image data whose number is at least twice as large as the number of image data of the output terminals 27. The controller 26 has a function of calculating the difference between the data signal which was output previously and the data signal which is output this time to each of the output terminals 27.

The D/A converter 24 can be a resistor-ladder D/A converter, a resistor-string D/A converter, a capacitor array D/A converter, a current source D/A converter, a delta-sigma (ΔΣ) D/A converter, or the like. After the image data is converted to an analog signal by the D/A converter 24, the analog signal is amplified by the buffer amplifier 25, and the amplified signal is output from the output terminal 27 as a data signal.

Figure 5:
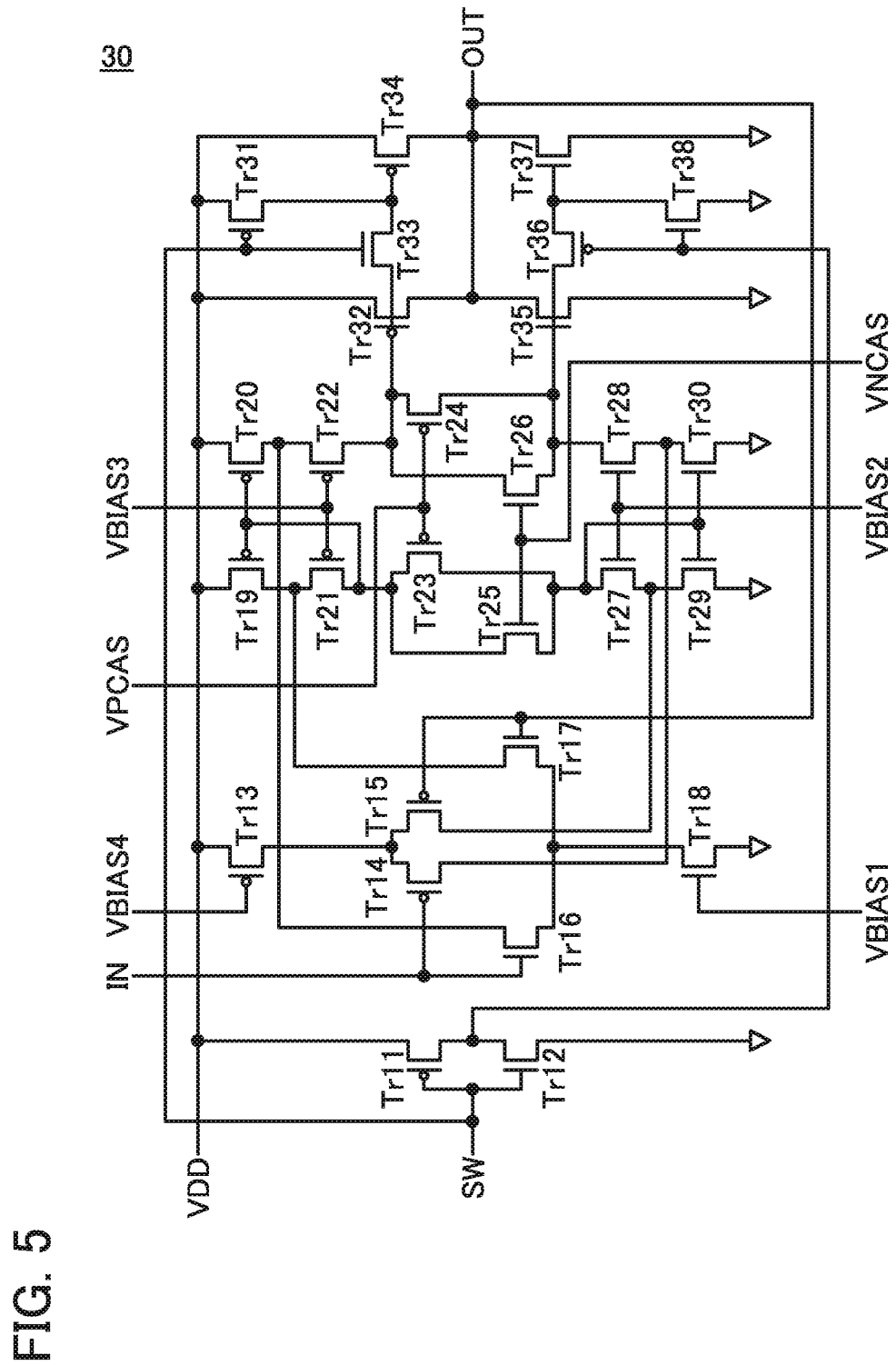
FIG. 5 is a circuit diagram illustrating a configuration example of a buffer amplifier.

Next, a circuit diagram which shows a configuration example of the buffer amplifier 25 is illustrated in FIG. 5.

The buffer amplifier 25 includes circuits 30 shown in FIG. 5 whose number corresponds to the number of output terminals 27. In the circuit 30 illustrated in FIG. 5, one of analog signals which are converted by the D/A converter 24 is input to an input terminal IN, and the analog signal is output from an output terminal OUT to one of the output terminals 27 which are included in the source driver 105*a*.

The circuit 30 includes transistors Tr11 to Tr38. VDD is a high power supply potential, and a control signal is input to VBIAS1 to VBIAS4, VPCAS, and VNCAS. The control signal is input from the controller 26 to the input terminal SW. The controller 26 outputs a high-level signal to the input terminal SW in the case where the difference between the data signal which was output previously and the data signal which is output this time is large, and outputs a low-level signal to the input terminal SW in the case where the difference is small.

The circuit 30 has a function of amplifying the source line which is electrically connected to the circuit 30 through the output terminal 27 so that charging and discharging can be performed in the predetermined time. The transistor at the output stage is important for charging and discharging the source line in the predetermined time, and the transistors Tr32 and Tr34 (p-channel transistor) and the transistors Tr35 and Tr37 (n-channel transistor) are the transistors at the output stage in the circuit 30.

Figure 4B:
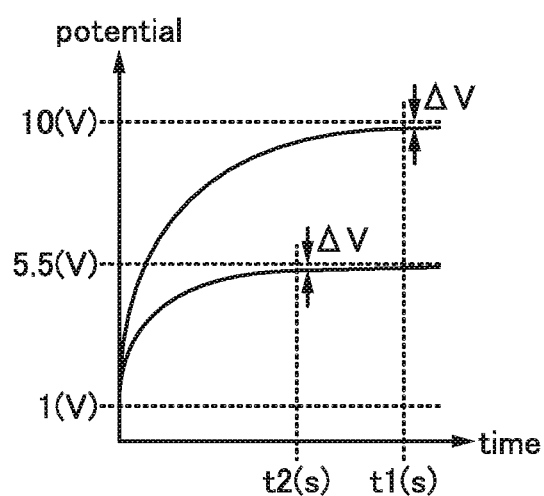

Next, a change in potential by charging the source line by the circuit 30 included in the buffer amplifier 25 is shown in a graph in FIG. 4B.

FIG. 4B is a graph showing the change in potential by charging one source line included in the pixel array 101 by the circuit 30. The horizontal axis indicates time and the vertical axis indicates a potential of the source line. The case where the circuit 30 charges the source line from 1 V to 10 V and the case where the circuit 30 charges from 1 V to 5.5 V are shown.

ΔV indicates a potential difference which satisfies the state of charge determined by the design standard. In the case where the charging and discharging operations require the longest time, the circuit 30 is designed so that a deviation from a target potential is less than or equal to ΔV in the prescribed time. In FIG. 4B, the longest time is required for the charging and discharging operations when charging is performed from 1 V to 10 V and the prescribed time is t1($s$).

In the case where the circuit 30 designed in the above conditions charges the source line from 1 V to 5.5 V, the time during which the deviation from 5.5 V becomes less than or equal to ΔV is shorter than t1($s$) as long as the transistor at the output stage is the same. This time is referred to as t2($s$). That is, in the case where charging is performed from 1 V to 5.5 V, t1-t2($s$) is a time during which charging is not necessary. However, also between t1-t2($s$), the transistor at the output stage of the circuit 30 operates while maintaining the balance of the p-channel transistor and the n-channel transistor, so that the through current flows from the p-channel transistor to the n-channel transistor.

Therefore, the controller 26 outputs a low-level signal in the case where the difference between the data signal which was output previously and the data which is output this time is small (in the case where charging is performed from 1 V to 5.5 V in FIG. 4B). When the controller 26 outputs a low-level signal, the transistors Tr34 and Tr37 of the circuit 30 are turned off (see FIG. 5). In this case, although t2($s$) is increased (becomes close to t1($s$)), the transistors Tr34 and Tr37 are turned off; thus, the through current flowing through the transistor at the output stage of the circuit 30 can be decreased.

Note that in FIG. 5, the transistors Tr31 and Tr38 are provided so as to turn off the transistors Tr34 and Tr37. The transistors Tr33 and Tr36 are provided so as to transmit or stop the supply of the control signals of the transistors Tr34 and Tr37. Furthermore, a plurality of combinations of the transistors Tr31, Tr33, and Tr34 and the transistors Tr38, Tr36, and Tr37 may be provided.

Furthermore, the controller 26 can be formed using a general logic circuit because the digital signal before being converted by the D/A converter 24 is used as reference. For example, when the image data is N-bit and when a higher-order bit which is higher than or equal to M-bit is changed, an output of a high-level signal can be determined by the controller 26. Here, M and N are each an integer greater than or equal to 1 and M is less than or equal to N.

More specifically, when the image data is 8-bit data and the high-level signal is output by the controller 26 when a higher-order bit is changed, the controller 26 outputs a low-level signal when the image data changes from '00000001' to '00001000' and the controller 26 outputs a high-level signal when the image data changes from '00000001' to '10000000'. By such an operation, the controller 26 outputs a high-level signal in the case where the charging and discharging of the source line at an amplitude of approximately more than or equal to half of the maximum output amplifier of the buffer amplifier 25 are needed.

<Flow Chart>

Figure 6:
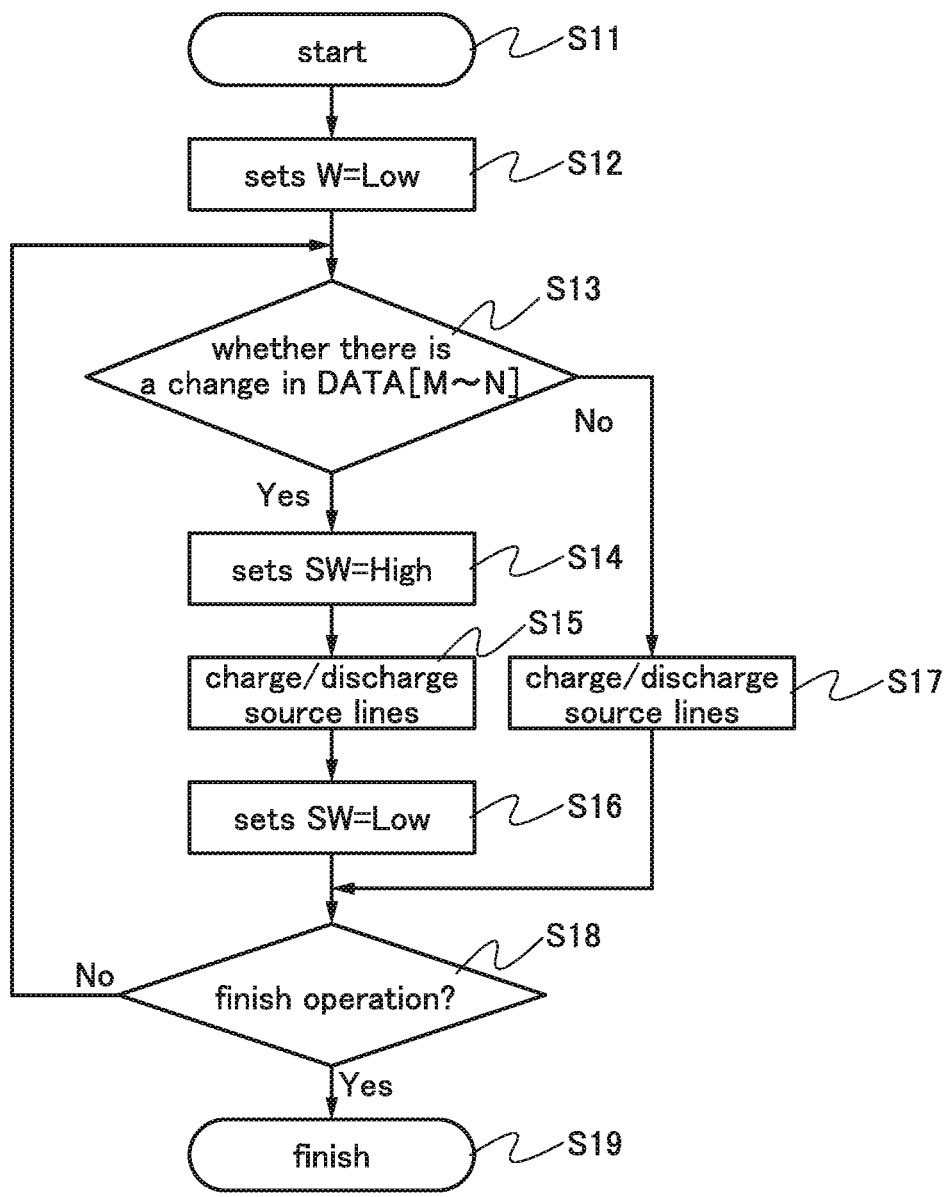
FIG. 6 is a flow chart relating to a controller and a buffer amplifier.

A flow chart relating to the controller 26 and the buffer amplifier 25 is shown in FIG. 6.

The source driver 105*a* starts operation (Step S11). The controller 26 sets the input terminal SW of the circuit 30 included in the buffer amplifier 25 at Low (Step S12).

The controller 26 determines whether there is a change in the high-order bit of more than or equal to M-bit (from M-bit to N-bit) to the image data of N-bit (Step S13). In the case where there is a change in the high-order bit of more than or equal to M-bit, the controller 26 sets the input terminal SW of the circuit 30 at High (Step S14).

The buffer amplifier 25 charges and discharges the source line which is electrically connected to the buffer amplifier 25 through the output terminal 27 (Step S15). The controller 26 sets the input terminal SW of the circuit 30 at Low (Step S16).

Furthermore, in the case where there is no change in the high-order bit of more than or equal to M-bit in Step S13, the input terminal SW of the circuit 30 remains at Low and the buffer amplifier 25 charges and discharges the source line (Step S17).

When the charge and discharge of the source line is finished, the circuit 30 determines whether to continue the operation (Step S18). In the case of continuing the operation, the procedure returns to Step S13. In the case of not continuing the operation, the source driver 105*a* terminates the operation (Step S19).

In this manner, when an image data saved in the data register 23 is referred to and the amount of change of data signals which are output to the source lines is small, the transistor size at the output stage of the source driver can be decreased. By decreasing the transistor size at the output stage, the power consumption of the source driver can be reduced, and the amount of heat generation can be reduced. In the source driver with high driving capability corresponding to the increased screen size, high definition, and high frame frequency of the display device, power consumption and the amount of heat generation can be suppressed.

Note that this embodiment can be implemented in combination with any other embodiment described in this specification as appropriate.

Embodiment 2

In this embodiment, the pixel 10 which can be used in the pixel array 101 in the above embodiment is described with reference to FIGS. 7A and 7B and FIGS. 8A and 8B.
<Pixel>

Figure 7A:
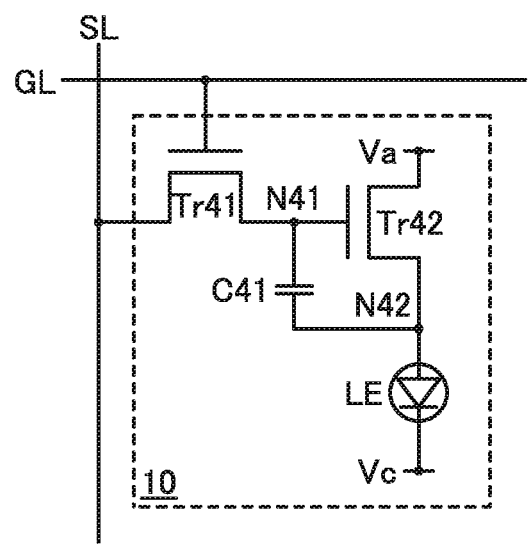
FIGS. 7A and 7B are circuit diagrams illustrating configuration examples of pixels.

FIG. 7A illustrates a configuration example of the pixel 10 including a light-emitting element as a display element. The pixel 10 illustrated in FIG. 7A includes transistors Tr41 and Tr42, a capacitor C41, and a light-emitting element LE. Note that although the transistors Tr41 and Tr42 are n-channel transistors here, the polarity of the transistors can be changed as appropriate.

A gate of the transistor Tr41 is electrically connected to the gate line GL. One of a source and a drain of the transistor Tr41 is electrically connected to a gate of the transistor Tr42 and one electrode of the capacitor C41. The other of the source and the drain of the transistor Tr41 is electrically connected to the source line SL. One of a source and a drain of the transistor Tr42 is electrically connected to the other electrode of the capacitor C41 and one electrode of the light-emitting element LE and the other of the source and the drain of the transistor Tr42 is electrically connected to a wiring to which a potential $V_a$ is supplied. The other electrode of the light-emitting element LE is electrically connected to a wiring to which a potential $V_c$ is supplied.

Here, a node which is electrically connected to the one of the source and the drain of the transistor Tr41, the gate of the transistor Tr42, and the one electrode of the capacitor C41 is referred to as a node N41. Furthermore, a node which is electrically connected to one of the source and the drain of the transistor Tr42 and the other electrode of the capacitor C41 is referred to as a node N42.

Here, the case where the potential Va is a high power supply potential and the potential Vc is a low power supply potential is described. The potential Va and the potential Vc can each be a common potential to the plurality of pixels 10. The capacitor C41 serves as a storage capacitor for holding a potential of the node N41.

Furthermore, the transistor Tr41 controls supply of a potential of the source line SL to the node N41. Specifically, the potential of the gate line GL is controlled to turn on the transistor Tr41, whereby the potential of the source line SL corresponding to the data signal is supplied to the node N41 and writing to the pixel 10 is performed. Then, the potential of the gate line GL is controlled to turn off the transistor Tr41, whereby the potential of the node N41 is held.

The current flowing between the source and the drain of the transistor Tr42 is controlled in accordance with the potential difference between the nodes N41 and N42. The light-emitting element LE emits light with a luminance corresponding to the flowing current. Accordingly, the gray level of the pixel 10 can be controlled. Note that the transistor Tr42 preferably operates in a saturation region.

Figure 7B:
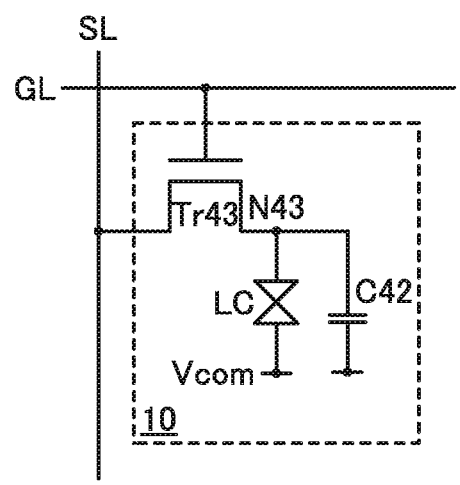

Furthermore, FIG. 7B illustrates a configuration example of the pixel 10 including a liquid crystal element as the display element. The pixel 10 shown in FIG. 7B includes a transistor Tr43, a capacitor C42, and a liquid crystal element LC. Note that although the transistor Tr43 is an n-channel transistor here, the polarity of the transistor can be changed as appropriate.

A gate of the transistor Tr43 is electrically connected to the gate line GL. One of a source and a drain of the transistor Tr43 is electrically connected to one electrode of the liquid crystal element LC and one electrode of the capacitor C42. The other of the source and the drain of the transistor Tr43 is electrically connected to the source line SL. The other electrode of the liquid crystal element LC is electrically connected to a wiring to which a potential Vcom is supplied. The other electrode of the capacitor C42 is electrically connected to a wiring to which a predetermined potential is supplied.

A node which is electrically connected to the one of the source and the drain of the transistor Tr43, the one electrode of the liquid crystal element LC, and the one electrode of the capacitor C42 is a node N43.

The potential Vcom can be a common potential to the plurality of pixels 10. The potential Vcom may be the same as a potential of a wiring which is electrically connected to the other electrode of the capacitor C42. The capacitor C42 functions as a storage capacitor for holding the potential of the node N43.

The transistor Tr43 has a function of controlling the supply of the potential of the source line SL to the node N43. Specifically, the potential of the gate line GL is controlled to turn on the transistor Tr43, whereby the potential of the source line SL corresponding to a data signal is supplied to the node N43, and thus is written to the pixel 10. After that, the potential of the gate line GL is controlled to turn off the transistor Tr43, whereby the potential of the node N43 is held.

The liquid crystal element LC includes a pair of electrodes and a liquid crystal layer containing a liquid crystal material to which the voltage between the pair of electrodes is applied. The alignment of liquid crystal molecules included in the liquid crystal element LC changes in accordance with the value of the voltage applied between the pair of electrodes, and thus the transmittance of the liquid crystal layer is changed. Therefore, when the potential supplied from the source line SL to the node N43 is controlled, the gray level of the pixel 10 can be controlled.

The above operation is performed for all the gate lines GL included in the pixel array 101, whereby an image of one frame can be displayed. Furthermore, by performing this operation 60 times per second, in other words, rewriting the image 60 times per second, a display device with a frame frequency of 60 Hz can be achieved.

Note that the driving of the gate lines GL may be performed by either a progressive method or an interlace method. The supply of data signals to the source lines SL may be performed by dot sequential driving in which the data signals are sequentially supplied to the source lines SL, or by line sequential driving in which the data signals are concurrently supplied to all the source lines SL. Alternatively, supply of data signals may be performed for every set of source lines SL.
<Transistor>

As the semiconductor of the transistors included in the pixels 10, a Group 14 element such as silicon or germanium, a compound semiconductor such as gallium arsenide, an organic semiconductor, a metal oxide, or the like can be used. Alternatively, the semiconductor may be a non-single-crystal semiconductor (e.g., amorphous semiconductor, microcrystalline semiconductor, or polycrystalline semiconductor) or a single crystal semiconductor.

Here, the transistors included in the pixels 10 preferably include an amorphous semiconductor, in particular, hydrogenated amorphous silicon (a-Si:H) in channel formation regions. The transistor including an amorphous semiconductor can be easily formed over a large-sized substrate; thus the transistor is suitable for manufacturing a display device having a large screen.

Furthermore, a transistor included in the pixel 10 can be a transistor (an OS transistor) including a metal oxide in a channel formation region. An OS transistor has higher field-effect mobility than a transistor including hydrogenated amorphous silicon does. In addition, an OS transistor does not require a crystallization process which has been necessary for a transistor using polycrystalline silicon or the like.

Furthermore, because OS transistors have an extremely low off-state current, in the case where OS transistors are used as the transistor Tr41 (or the transistor Tr43), data signals can be held in the pixels 10 for a significantly long period. This enables the update frequency of a data signal to be low in a period when there is no change in the image displayed on the pixel array 101 or a period when the change is at a certain level or lower. Furthermore, the frame frequency can be lowered temporarily.

The update frequency of the data signal can be, for example, lower than or equal to once every 0.1 seconds, lower than or equal to once every second, or lower than or equal to once every 10 seconds. In particular, in the case where the display device is ultra-high definition, super-high definition, or the like in which a plurality of pixels 10 are provided, power consumption can be effectively reduced by reducing the frequency of rewriting the data signal.

<Cross-Sectional View>

Figure 8A:
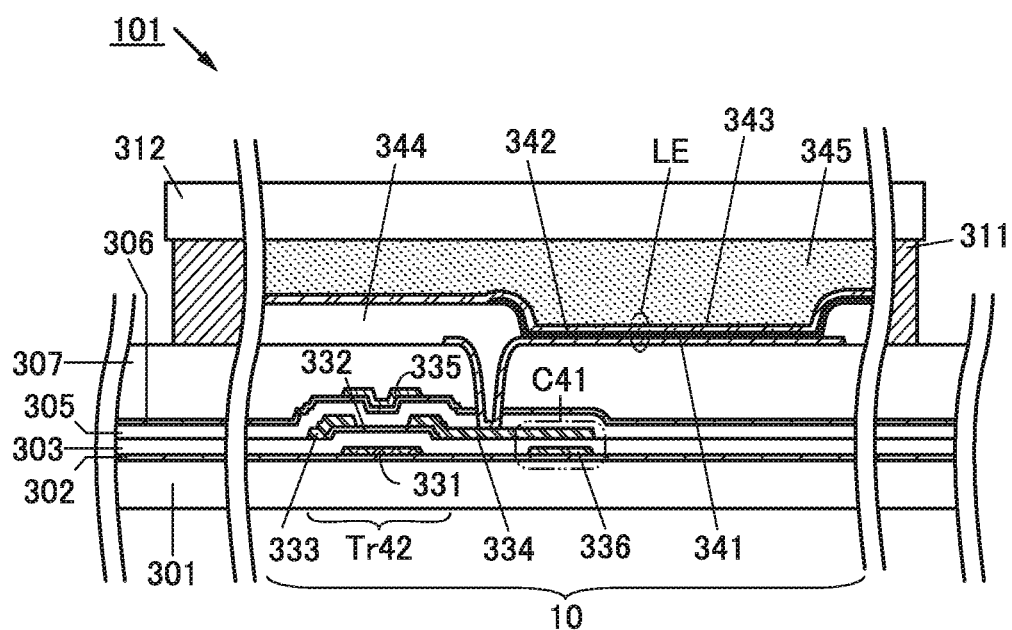
FIGS. 8A and 8B are cross-sectional views illustrating structure examples of pixels.
Figure 8B:
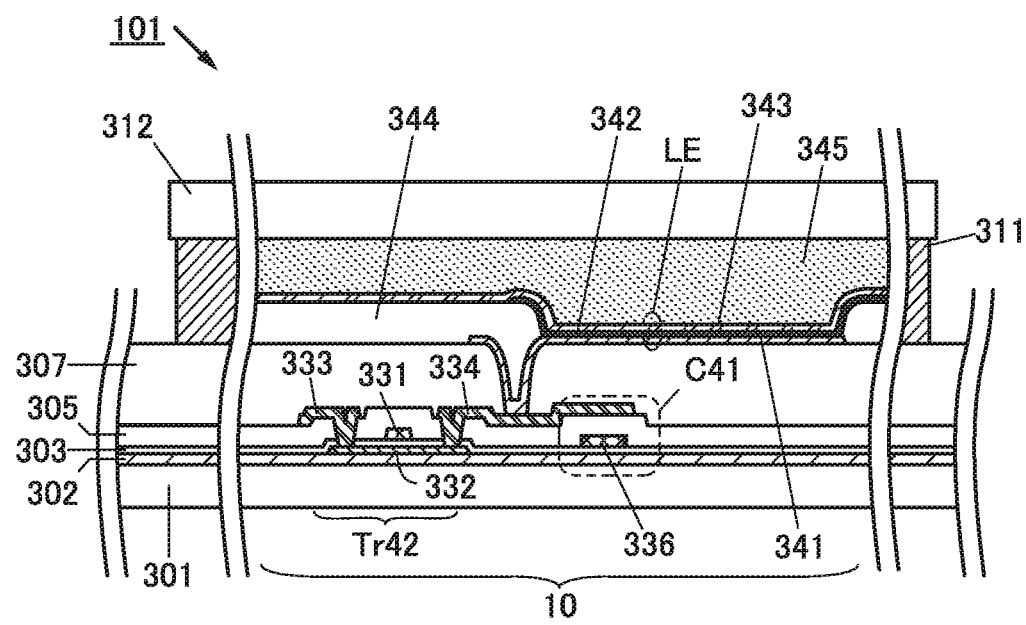

Specific structure examples of the pixel array 101 and the pixel 10 will be described using the cross-sectional views shown in FIGS. 8A and 8B. Note that the cross-sectional views shown in FIGS. 8A and 8B are examples using a light-emitting element, in particular, an organic EL element, as a display element.

The pixel 10 provided over a substrate 301 includes the transistor Tr42 (see FIG. 7A). Furthermore, the transistor Tr42 is provided over an insulating layer 302. Furthermore, the transistor Tr42 includes an electrode 331 over the insulating layer 302, and an insulating layer 303 is formed over the electrode 331. A semiconductor layer 332 is provided over the insulating layer 303. An electrode 333 and an electrode 334 are provided over the semiconductor layer 332, an insulating layer 305 and an insulating layer 306 are provided over the electrode 333 and the electrode 334, and an electrode 335 is provided over the insulating layer 305 and the insulating layer 306.

In the transistor Tr42, the electrode 331 serves as a gate electrode, the electrode 333 serves as one of a source electrode and a drain electrode, the electrode 334 serves as the other of the source electrode and the drain electrode, and the electrode 335 serves as a back gate electrode.

Since the transistor Tr42 has a bottom gate structure and include a back gate, the on-state current of the transistor can be increased. Moreover, the threshold voltage of the transistors can be controlled. The electrode 335 is not necessarily formed in some cases to simplify the manufacturing process.

In the case where the transistor (OS transistor) including the metal oxide in the channel formation region of the transistor Tr42 is used as the semiconductor material used for the transistor, the metal oxide preferably includes a material represented by an In-M-Zn-based oxide that contains at least indium, zinc, and M (M is a metal such as aluminum, titanium, gallium, germanium, yttrium, zirconium, lanthanum, cerium, tin, neodymium, or hafnium). In order to reduce variations in electrical characteristics of the transistors including the metal oxide, the oxide preferably contains a stabilizer in addition to indium, zinc, and M.

As the stabilizer, gallium, tin, hafnium, aluminum, zirconium, or the like can be used. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of a metal oxide included in the semiconductor layer is 2 eV or more, preferably 2.5 eV or more, and more preferably 3 eV or more. With the use of a metal oxide having such a wide energy gap, the off-state current of the transistor can be reduced.

In the case where a metal oxide included in the semiconductor layer is an In-M-Zn oxide, it is preferable that the atomic ratio of metal elements of a sputtering target used for forming a film of the In-M-Zn oxide satisfy In M and Zn M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

A metal oxide with low carrier density is preferably used as the semiconductor layer.

For example, the semiconductor layer can be formed using a metal oxide whose carrier density is lower than or equal to $1\times10^{17}/cm^3$, preferably lower than or equal to $1\times10^{15}/cm^3$, more preferably lower than or equal to $1\times10^{13}/cm^3$, still more preferably lower than or equal to $1\times10^{11}/cm^3$, even more preferably lower than $1\times10^{10}/cm^3$ and is higher than or equal to $1\times10^{-9}/cm^3$. Such a semiconductor layer has a low impurity concentration and a low density of defect states and thus has stable characteristics.

Note that without limitation to the compositions and materials described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in a metal oxide included in the semiconductor layer, oxygen vacancies are increased in the semiconductor layer, and the semiconductor layer becomes n-type in some cases. Thus, the concentration of silicon or carbon (measured by secondary ion mass spectrometry) in the semiconductor layer is lower than or equal to $2\times10^{18}$ atoms/cm$^3$, preferably lower than or equal to $2\times10^{17}$ atoms/cm$^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is lower than or equal to $1\times10^{18}$ atoms/cm$^3$, preferably lower than or equal to $2\times10^{16}$ atoms/cm$^3$.

The metal oxide may have a non-single-crystal structure, for example. Non-single-crystal structures include a polycrystalline structure, a microcrystalline structure, and an amorphous structure, for example. Among the non-single-crystal structure, the amorphous structure has the highest density of defect states.

A metal oxide having an amorphous structure has disordered atomic arrangement and no crystalline component, for example. Alternatively, the oxide films having an amorphous structure have, for example, an absolutely amorphous structure and no crystal part.

Note that the metal oxide may be a mixed film including two or more of the following: a region having an amorphous structure, a region having a microcrystalline structure, a region having a polycrystalline structure, and a region having a single-crystal structure. Furthermore, the mixed film has, for example, a single-layer structure or a stacked-layer structure including two or more of the above-described regions in some cases.

The above-described semiconductor material can be used for not only the transistor Tr42 but also the transistor Tr41 in FIG. 7A and the transistor Tr43 in FIG. 7B.

Furthermore, the pixel 10 includes the capacitor C41. The capacitor C41 includes a region where the electrode 334 and the electrode 336 overlap with each other with the insulating layer 303 provided therebetween. The electrode 336 is formed using the same material as the electrode 331.

FIGS. 8A and 8B show examples where a light-emitting element, in particular, an organic EL element is used as a display element. EL elements are classified into organic EL elements and inorganic EL elements; thus an organic EL element and inorganic EL elements will be described below.

In the organic EL element, by voltage application, electrons are injected from one electrode to the EL layer and holes are injected from the other electrode to the EL layer. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element. In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like. The EL layer can be formed by an evaporation method (including a vacuum evaporation method), a transfer method, a printing method, an inkjet method, a coating method, or the like.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localization type light emission that utilizes inner-shell electron transition of metal ions.

In FIG. 8A, the light-emitting element LE is connected to the transistor Tr42 provided in the pixel 10. Note that the light-emitting element LE includes a stack of an electrode layer 341, a light-emitting layer 342, and an electrode layer 343; however, the structure of the light-emitting element LE is not limited thereto. The structure of the light-emitting element LE can be changed as appropriate depending on the direction in which light is extracted from the light-emitting element LE, or the like.

Partitions 344 is formed using an organic insulating material or an inorganic insulating material. It is particularly preferable that the partition be formed using a photosensitive resin material to have an opening over the electrode layer 341 so that a side surface of the opening slopes with continuous curvature.

The light-emitting layer 342 may be composed of a single layer or a stack of a plurality of layers.

A protective layer may be formed over the electrode layer 343 and the partition 344 in order to prevent entry of oxygen, hydrogen, moisture, carbon dioxide, or the like into the light-emitting element LE. For the protective layer, silicon nitride, silicon nitride oxide, aluminum oxide, aluminum nitride, aluminum oxynitride, aluminum nitride oxide, diamond like carbon (DLC), or the like can be used. In addition, in a space which is formed with the substrate 301, the substrate 312, and the sealant 311, a filler 345 is provided and sealed. It is preferable that the light-emitting element LE be packaged (sealed) with a protective film (such as a laminate film or an ultraviolet curable resin film) or a cover member with high air-tightness and little degasification so that the light-emitting element LE is not exposed to the outside air, in this manner.

As the filler 345, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), or ethylene vinyl acetate (EVA) can be used. A drying agent may be contained in the filler 345.

A glass material such as a glass frit, or a resin that is curable at room temperature such as a two-component-mixture-type resin, a light curable resin, a thermosetting resin, and the like can be used for the sealant 311. A drying agent may be contained in the sealant 311.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The electrode layer 341 and the electrode layer 343 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The electrode layer 341 and the electrode layer 343 can also be formed using one or more selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys thereof; or nitrides thereof.

Alternatively, a conductive composition containing a conductive high molecule (also referred to as a conductive polymer) can be used to form the electrode layer 341 and the electrode layer 343. As the conductive high molecule, a so-called π-electron conjugated conductive high molecule can be used. For example, polyaniline or a derivative thereof, polypyrrole or a derivative thereof, polythiophene or a derivative thereof, a copolymer of two or more of aniline, pyrrole, and thiophene or a derivative thereof can be given.

In order to extract light emitted from the light-emitting element LE to the outside, it is acceptable as long as at least one of the electrode layer 341 and the electrode layer 343 is transparent. In accordance with how light is extracted, the structures of display devices are classified into a top emission structure, a bottom emission structure, and a dual emission structure. In the top emission structure, light is extracted from the substrate 312 side. In the bottom emission structure, light is extracted from the substrate 301 side. In the dual emission structure, light is extracted from both the substrate 312 side and the substrate 301 side. In the case where the display device has the top emission structure, for example, the electrode layer 343 is transparent. In the case where the display device has the bottom emission structure, for example, the electrode layer 341 is transparent. In the case where the display device has the dual emission structure, for example, the electrode layer 341 and the electrode layer 343 are transparent.

FIG. 8B shows a cross-sectional view in the case where the top gate transistor is provided as the transistor Tr42 illustrated in FIG. 8A. In the transistor Tr42 of FIG. 8B, the electrode 331 functions as a gate electrode, the electrode 333 functions as one of a source electrode and a drain electrode, and the electrode 334 functions as the other of the source electrode and the drain electrode.

For other components in FIG. 8B, refer to the description of FIG. 8A. Although a light-emitting element is used as the display element in FIGS. 8A and 8B, a liquid crystal element can be used as the display element as illustrated in FIG. 7B.

Note that this embodiment can be combined with any of the other embodiments in this specification as appropriate.

Embodiment 3

In this embodiment, an electronic device of one embodiment of the present invention will be described with reference to drawings.

The display devices 100 and 110 described in any of the above embodiments can be provided in any of the examples of the electronic device described below. Thus, an electronic device having a display portion with a high resolution and which is capable of increasing the screen size can be provided.

Examples of electronic devices include electronic devices having relatively large screens such as a television set, a desktop or laptop personal computer, a monitor of a computer, digital signage, and a large game machine (e.g., a pachinko machine); a digital camera; a digital video camera; a digital photo frame; a mobile phone; a portable game console; a portable information terminal; an audio reproducing device; and the like.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 9A:
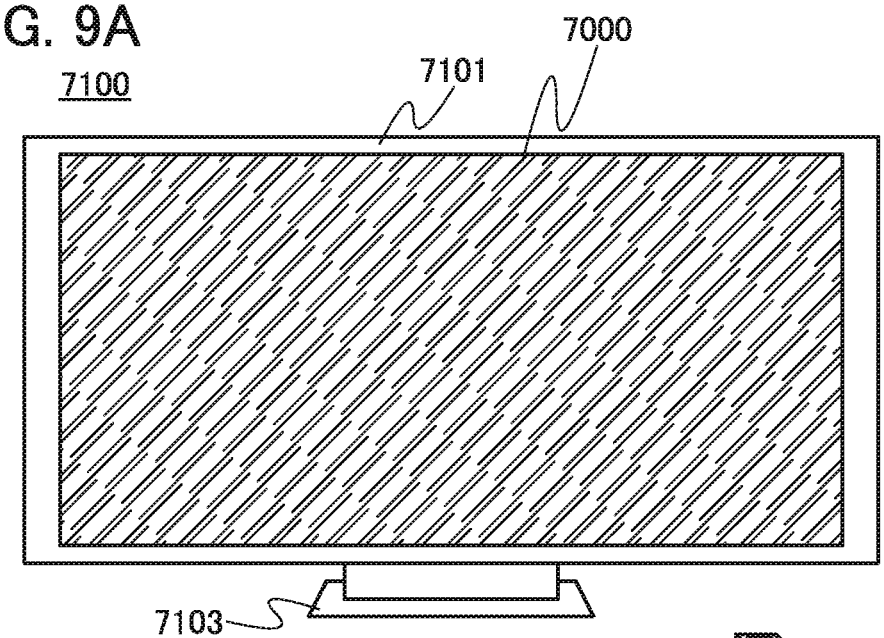
FIGS. 9A to 9C each illustrate a structure of an electronic device.

FIG. 9A illustrates an example of a television device. In a television device 7100, a display portion 7000 is incorporated in a housing 7101. In addition, here, the housing 7101 is supported by a stand 7103.

The display device of one embodiment of the present invention can be used in the display portion 7000 illustrated in FIG. 9A.

The television device 7100 illustrated in FIG. 9A can be operated with an operation switch provided in the housing 7101 or a separate remote controller 7111. Furthermore, the display portion 7000 may include a touch sensor. The display portion 7000 can be operated by touching the display portion 7000 with a finger or the like. Furthermore, the remote controller 7111 may be provided with a display portion for displaying data output from the remote controller 7111. With operation keys or a touch panel of the remote controller 7111, channels and volume can be controlled and images displayed on the display portion 7000 can be controlled.

Note that the television device 7100 can be provided with a receiver, a modem, and the like. With the use of the receiver, general television broadcasting can be received. When the television device is connected to a communication network with or without wires via the modem, one-way (from a transmitter to a receiver) or two-way (between a transmitter and a receiver or between receivers) data communication can be performed.

Figure 9B:
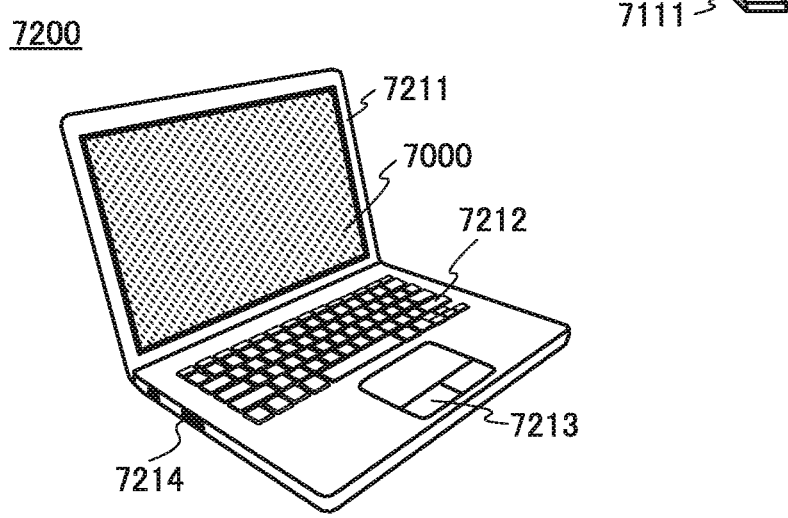

FIG. 9B illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000 illustrated in FIG. 9B.

Figure 9C:
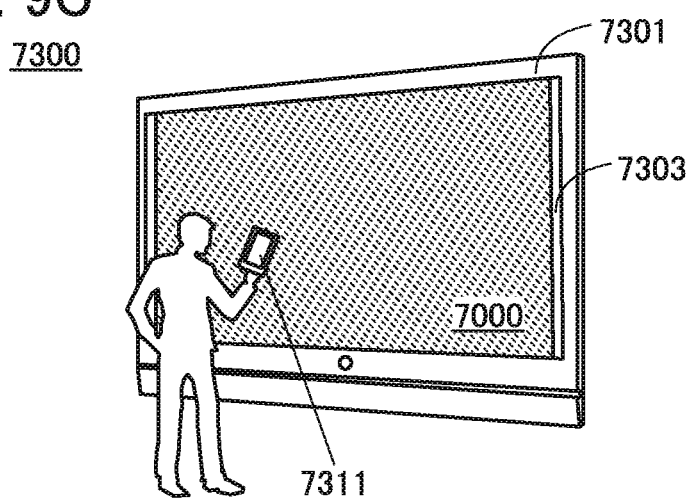

FIG. 9C illustrates an example of a digital signage.

A digital signage 7300 illustrated in FIG. 9C includes a housing 7301, the display portion 7000, a speaker 7303, and the like. Also, the digital signage can include an LED lamp, operation keys (including a power switch or an operation switch), a connection terminal, a variety of sensors, a microphone, and the like.

The display device of one embodiment of the present invention can be used in the display portion 7000 illustrated in FIG. 9C.

A larger area of the display portion 7000 can provide more information at a time. In addition, the larger display portion 7000 attracts more attention, so that the effectiveness of the advertisement can be increased, for example.

It is preferable to use a touch panel in the display portion 7000 because a device with such a structure does not just display a still or moving image, but can be operated by users intuitively. Alternatively, in the case where the display device of one embodiment of the present invention is used for providing information such as route information or traffic information, usability can be enhanced by intuitive operation.

Furthermore, as illustrated in FIG. 9C, it is preferable that the digital signage 7300 works with an information terminal 7311 such as a smartphone a user has through wireless communication. For example, information of an advertisement displayed on the display portion 7000 can be displayed on a screen of the portable information terminal 7311. Moreover, by operation of the portable information terminal 7311, a displayed image on the display portion 7000 can be switched.

Furthermore, it is possible to make the digital signage 7300 execute a game with use of the screen of the information terminal 7311 as an operation means (controller). Thus, an unspecified number of people can join in and enjoy the game concurrently.

Furthermore, the display system of one embodiment of the present invention can be incorporated along an inside/outside wall surface of a house or a building.

Note that this embodiment can be implemented in combination with any other embodiment described in this specification as appropriate.

REFERENCE NUMERALS

C1: arrow, C41: capacitor, C42: capacitor, IN: input terminal, N41: node, N42: node, N43: node, OUT: output terminal, R1: arrow, SW: input terminal, Tr11: transistor, Tr31: transistor, Tr32: transistor, Tr34: transistor, Tr35: transistor, Tr37: transistor, Tr38: transistor, Tr41: transistor, Tr42: transistor, Tr43: transistor, VBIAS1: control signal, VBIAS4: control signal, VPCAS: control signal, VNCAS: control signal, 10: pixel, 21: semiconductor device, 22: interface, 23: data register, 24: D/A converter, 25: buffer amplifier, 26: controller, 27: output terminal, 30: circuit, 100: display device, 101: pixel array, 102: gate driver, 103: gate driver, 104*a*: terminal, 104*d*: terminal, 105: source driver, 105*a*: source driver, 105*f*: source driver, 106: source driver, 106*a*: source driver, 106*f*: source driver, 110: display device, 301: substrate, 302: insulating layer, 303: insulating layer, 305: insulating layer, 306: insulating layer, 311: sealant, 312: substrate, 331: electrode, 332: semiconductor layer, 333: electrode, 334: electrode, 335: electrode, 336: electrode, 341: electrode layer, 342: light-emitting layer, 343: electrode layer, 344: partition, 345: filler, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal.

This application is based on Japanese Patent Application Serial No. 2017-052965 filed with Japan Patent Office on Mar. 17, 2017, the entire contents of which are hereby incorporated by reference.

The invention claimed is:

1. A semiconductor device comprising:
   a data register;
   a controller;
   a D/A converter; and
   a buffer amplifier,
   wherein the data register is configured to store a first data and a second data,
   wherein the data register outputs the first data and the second data alternately to the D/A converter,
   wherein the D/A converter is configured to convert the first data or the second data input from the data register into an analog signal,
   wherein the buffer amplifier is configured to amplify the analog signal and charge and discharge a predetermined load within predetermined time,
   wherein the buffer amplifier comprises a first transistor, a second transistor, a third transistor, a fourth transistor, a fifth transistor, and a sixth transistor,
   wherein the controller calculates the amount of change between the first data and the second data, and
   wherein the controller invalidates the part of the function of charge and discharge by turning off the second transistor, the third transistor, the fifth transistor, and the sixth transistor when the amount of change is smaller than a predetermined amount.

2. A display device comprising:
a pixel array; and
a source driver,
wherein the pixel array comprises source lines and pixels,
wherein the source driver comprises a data register, a controller, a D/A converter, and a buffer amplifier,
wherein the data register is configured to store a first image data and a second image data,
wherein the data register outputs the first image data and the second image data alternately to the D/A converter,
wherein the D/A converter is configured to convert the first image data or the second image data input from the data register into an analog signal,
wherein the buffer amplifier is configured to amplify the analog signal and supply the amplified data to the source line within predetermined time,
wherein the buffer amplifier comprises a first transistor, a second transistor, a third transistor, and a fourth transistor,
wherein the controller calculates the amount of change between the first image data and the second image data, and
wherein the controller invalidates the part of the function of supply by turning off the first transistor, the second transistor, the third transistor, and the fourth transistor when amount of change is smaller than a predetermined amount.

3. The display device according to claim 2,
wherein the pixel array comprises gate lines,
wherein the pixels are arranged in a matrix in a direction parallel to the source line and in a direction parallel to the gate line,
wherein the number of pixels arranged in a direction parallel to the source line is N times the number of gate lines,
wherein N is an integer greater than or equal to 2, and
wherein the number of pixels arranged in a direction parallel to the gate line is 1/N times the number of source lines.

4. The display device according to claim 2,
wherein the pixel comprises a transistor comprising a metal oxide in a channel formation region.

5. A semiconductor device comprising:
a data register;
a controller;
a D/A converter; and
a buffer amplifier,
wherein the data register is configured to store a first data and a second data,
wherein the data register outputs the first data and the second data alternately to the D/A converter,
wherein the D/A converter is configured to convert the first data or the second data input from the data register into an analog signal,
wherein the buffer amplifier is configured to amplify the analog signal and charge and discharge a predetermined load within predetermined time,
wherein the buffer amplifier comprises a first transistor, a second transistor, a third transistor, a fourth transistor, a fifth transistor, and a sixth transistor,
wherein one of a source and a drain of the first transistor is electrically connected to a first power source line,
wherein the other of the source and the drain of the first transistor is electrically connected to one of a source and a drain of the second transistor,
wherein the other of the source and the drain of the second transistor is electrically connected to the first power source line,
wherein one of a source and a drain of the third transistor is electrically connected to a gate of the first transistor,
wherein the other of the source and the drain of the third transistor is electrically connected to a gate of the second transistor,
wherein one of a source and a drain of the fourth transistor is electrically connected to a second power source line,
wherein the other of the source and the drain of the fourth transistor is electrically connected to the other of the source and the drain of the first transistor,
wherein one of a source and a drain of the fifth transistor is electrically connected to the second power source line,
wherein the other of the source and the drain of the fifth transistor is electrically connected to one of the source and the drain of the second transistor,
wherein one of a source and a drain of the sixth transistor is electrically connected to a gate of the fourth transistor,
wherein the other of the source and the drain of the sixth transistor is electrically connected to a gate of the fifth transistor,
wherein the controller calculates the amount of change between the first data and the second data, and
wherein the controller invalidates the part of the function of charge and discharge by turning off the second transistor, the third transistor, the fifth transistor, and the sixth transistor when the amount of change is smaller than a predetermined amount.

6. The semiconductor device according to claim 5,
wherein the buffer amplifier comprises a seventh transistor and an eighth transistor,
wherein one of a source and a drain of the seventh transistor is electrically connected to the first power source line,
wherein the other of the source and the drain of the seventh transistor is electrically connected to a gate of the second transistor,
wherein one of a source and a drain of the eighth transistor is electrically connected to the second power source line, and
wherein the other of the source and the drain of the eighth transistor is electrically connected to a gate of the fifth transistor.

7. The display device according to claim 3,
wherein the pixel comprises a transistor comprising a metal oxide in a channel formation region.

8. The semiconductor device according to claim 1,
wherein one of a source and a drain of the first transistor is electrically connected to a first power source line, and
wherein the other of the source and the drain of the first transistor is electrically connected to one of a source and a drain of the second transistor.

9. The semiconductor device according to claim 8,
wherein the other of the source and the drain of the second transistor is electrically connected to the first power source line, and
wherein one of a source and a drain of the third transistor is electrically connected to a gate of the first transistor.

10. The semiconductor device according to claim 9,
wherein the other of the source and the drain of the third transistor is electrically connected to a gate of the second transistor, and wherein one of a source and a drain of the fourth transistor is electrically connected to a second power source line.

11. The display device according to claim 2,
wherein one of a source and a drain of the first transistor is electrically connected to a first power source line, and
wherein one of a source and a drain of the second transistor is electrically connected to a gate of the first transistor.

12. The display device according to claim 11,
wherein one of a source and a drain of the third transistor is electrically connected to a second power source line, and
wherein the other of the source and the drain of the third transistor is electrically connected to the other of the source and the drain of the first transistor.

13. The display device according to claim 12, wherein one of a source and a drain of the fourth transistor is electrically connected to a gate of the third transistor.

* * * * *